(12) United States Patent
Aoki et al.

(10) Patent No.: US 8,409,919 B2
(45) Date of Patent: Apr. 2, 2013

(54) METHOD FOR MANUFACTURING SEMICONDUCTOR DEVICE

(75) Inventors: Hideo Aoki, Yokohama (JP); Masatoshi Fukuda, Yokohama (JP); Kanako Sawada, Yokohama (JP); Yasuhiro Koshio, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 12/882,673

(22) Filed: Sep. 15, 2010

(65) Prior Publication Data

US 2011/0076801 A1 Mar. 31, 2011

(30) Foreign Application Priority Data

Sep. 29, 2009 (JP) ................................. 2009-225381

(51) Int. Cl.
*H01L 21/60* (2006.01)
(52) U.S. Cl. . 438/108; 257/778; 257/780; 257/E21.506; 257/E21.508; 257/E21.509; 257/E21.511; 257/E23.021; 438/115; 438/612; 438/613
(58) Field of Classification Search .................. 257/778, 257/780, E21.506, E21.508, E21.509, E21.511, 257/E23.021; 438/108, 115, 612, 613
See application file for complete search history.

(56) References Cited

U.S. PATENT DOCUMENTS

| | | | |
|---|---|---|---|
| 5,992,729 A * | 11/1999 | Koopman et al. | 228/175 |
| 6,121,062 A | 9/2000 | Karasawa et al. | |
| 6,344,407 B1 * | 2/2002 | Matsuki et al. | 438/613 |
| 6,666,369 B2 | 12/2003 | Matsuki et al. | |
| 2005/0023327 A1 * | 2/2005 | Pendse | 228/180.22 |
| 2010/0320258 A1 | 12/2010 | Sawada et al. | |

FOREIGN PATENT DOCUMENTS

| | | |
|---|---|---|
| EP | 0638926 | 2/1995 |
| JP | 3194553 | 6/2001 |
| JP | 2001-244283 | 9/2001 |
| JP | 2004-130351 | 4/2004 |
| JP | 2008-041980 | 2/2008 |
| JP | 2011-003765 | 1/2011 |

OTHER PUBLICATIONS

Korean Office Action for Korean Application No. 10-2011-0003400 mailed on Apr. 10, 2012.

* cited by examiner

*Primary Examiner* — Peniel M Gumedzoe
(74) *Attorney, Agent, or Firm* — Turocy & Watson, LLP

(57) ABSTRACT

According to a manufacturing method of one embodiment, a first solder bump and a second solder bump are aligned and placed in contact with each other, and thereafter, the first and second solder bumps are heated to a temperature equal or higher than a melting point of the solder bumps and melted, whereby a partially connection body of the first solder bump and the second solder bump is formed. The partially connection body is cooled. The cooled partially connection body is heated to a temperature equal to or higher than the melting point of the solder bump in a reducing atmosphere, thereby to form a permanent connection body by melting the partially connection body while removing an oxide film existing on a surface of the partially connection body.

16 Claims, 7 Drawing Sheets

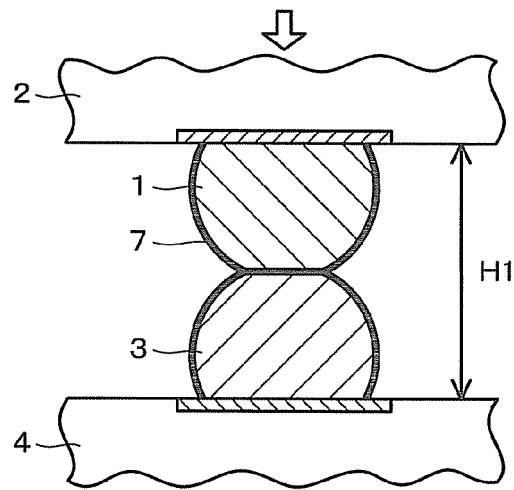
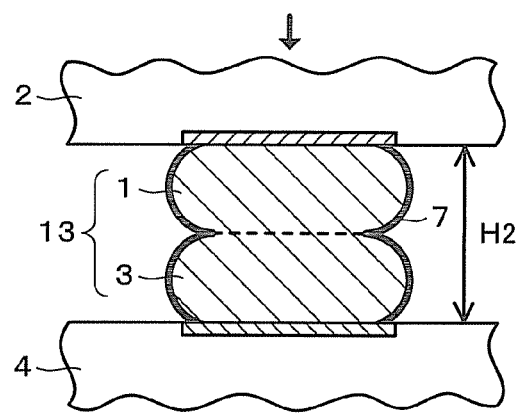
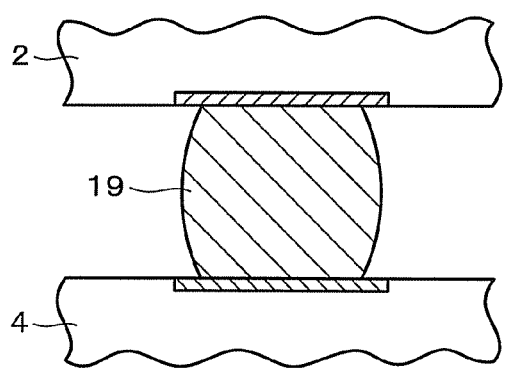

METHOD FOR MANUFACTURING SEMICONDUCTOR DEVICE

CROSS-REFERENCE TO RELATED APPLICATION

This application is based upon and claims the benefit of priority from the prior Japanese Patent Application No. 2009-225381, filed on Sep. 29, 2009; the entire contents of which are incorporated herein by reference.

FIELD

Embodiments described herein relate generally to a method for manufacturing a semiconductor device.

BACKGROUND

In order to cope with increased number of pins of a semiconductor chip, a finer pitch, and an increase of a signal speed, there is used a semiconductor device to which flip-chip connection is applied as a mounting method with short wiring and connection. When flip-chip connection is applied to connection between semiconductor chips or connection between a semiconductor chip and a silicon interposer, solder bumps are each formed on electrode terminals of upper and lower chips (semiconductor chip, silicon interposer), the upper and lower chips are position-adjusted so that those solder bumps faces each other and then stacked, and thereafter, the solder bumps are heated and melted thereby to be connected.

In order to remove an oxide film on a solder bump surface, processes described below are usually applied. First, after a flux is applied to the solder bump surface, upper and lower chips are position-adjusted and stacked. Next, after the solder bumps are heated and melted in a reflow furnace thereby to be connected, the flux is washed and removed. However, if the flux is to be removed after connection between the upper and lower chips is done, it is difficult to completely wash the flux due to miniaturization of the solder bump itself or microfabrication of a formation pitch. Thus, a residue of the flux is becoming a problem. The flux residue causes generation of a void or peeling of an underfill agent filled between the chips.

JP-B2 3194553 describes a method in which, after an oxide film on a surface of a solder bump formed on an electrode of a semiconductor chip is removed by a flux and further the flux is washed and removed, the solder bump is pressure-bonded and temporarily fixed on an electrode of a circuit board, with a height thereof being adjusted, and the solder bump is melted in that state thereby to be connected. However, since an oxide film of a bump surface grows even at a room temperature and in the atmosphere, there is a possibility that, even if the oxide film of the bump surface is removed in advance, an oxide film grows on that surface at a time that the solder bump is temporarily fixed. If such an oxide film is sandwiched between interfaces at the time of temporarily fixing (pressure-bonding), the oxide film is left inside the bump when the solder bump is melted, causing generation of a void or a connection failure.

JP-A 2001-244283 (KOKAI) describes a method in which a semiconductor chip having a solder bump is disposed in a reduced pressure atmosphere containing carboxylic acid gas in a state of being mounted on a wiring board, and the solder bump is heated and melted in that atmosphere, whereby the semiconductor chip and the wiring board are connected while an oxide film formed on a surface of the solder bump or a wiring is removed. A necessity occurs to temporarily fix the solder bump to the wiring board in order to increase location accuracy of the semiconductor chip and the wiring board. In such a case, it becomes difficult to remove the oxide film trapped in an interface between the solder bump and the wiring board by carboxylic acid gas, causing generation of a void or a connection failure in the solder bump.

JP-A 2008-041980 (KOKAI) describes a method in which a semiconductor chip having a solder bump and an intermediate substrate are disposed in a vacuum chamber in a state of being placed to face each other, and after hydrogen radical is introduced into the vacuum chamber thereby to remove an oxide film of a bump surface, the solder bump is melted and connection is performed. In this method, since removing of the oxide film from the solder bump surface to melting of the solder bump are performed in the vacuum chamber, rise of a manufacturing cost of a semiconductor device is inevitable. Further, since conventional position adjustment by a flip-chip bonder cannot be applied, a spacer made of solder is applied to position adjustment, leading to rise of a cost or restriction in terms of design.

BRIEF DESCRIPTION OF THE DRAWINGS

FIG. 5A to FIG. 5C are cross-sectional views enlargedly showing the solder bumps in the contact process to the permanent connection process in the first embodiment.

DETAILED DESCRIPTION

In one embodiment, a method for manufacturing a semiconductor device includes contacting a first solder bump provided in a first substrate and a second solder bump provided in a second substrate while aligning the first solder bump and the second solder bump, melting the first and second solder bumps by performing heating to a temperature equal to or higher than a melting point of the first and second solder bumps, to form a partially connection body of the first solder bump and the second solder bump, cooling the partially connection body, and heating the partially connection body after the cooling to a temperature equal to or higher than the melting point of the first and second solder bumps in a reducing atmosphere, to form a permanent connection body by melting the partially connection body while removing an oxide film existing on a surface of the partially connection body.

In another embodiment, a method for manufacturing a semiconductor device includes contacting a first solder bump provided in a first substrate and a second solder bump provided in a second substrate while aligning the first solder bump and the second solder bump, applying an ultrasonic energy to the first and second solder bumps to form a partially connection body of the first solder bump and the second solder bump, and heating the partially connection body to a temperature equal to or higher than a melting point of the first and second solder bumps in a reducing atmosphere, to form a permanent connection body by melting the partially connection body while removing an oxide film existing on a surface of the partially connection body.

First Embodiment

Figure 1:
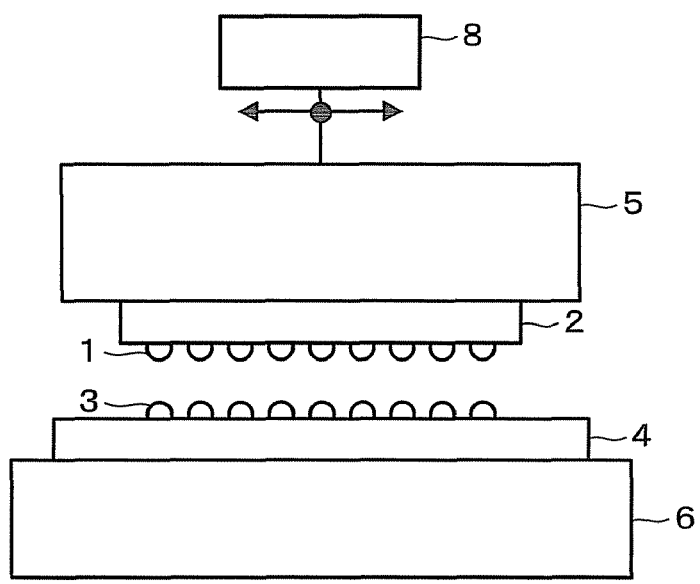
FIG. 1 is a diagram showing a position adjustment process of a first solder bump and a second solder bump in a method for manufacturing a semiconductor device of a first embodiment.
Figure 2:
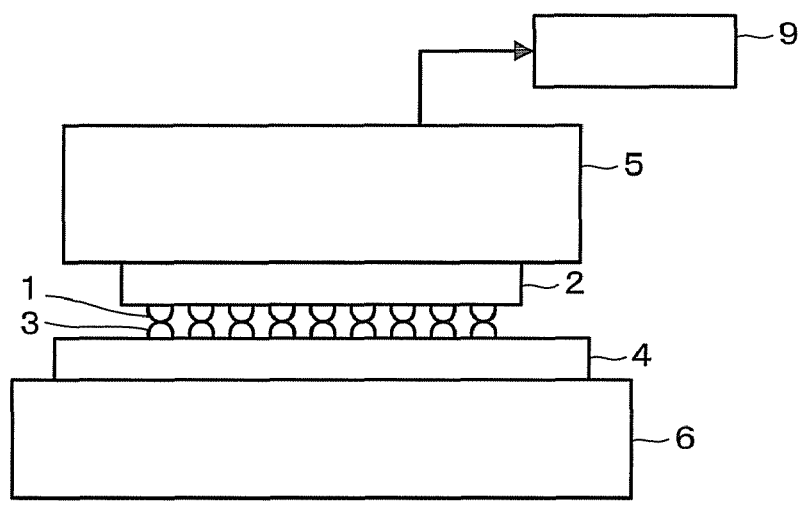
FIG. 2 is a diagram showing a contact process of the first solder bump and the second solder bump in the method for manufacturing the semiconductor device of the first embodiment.
Figure 3:
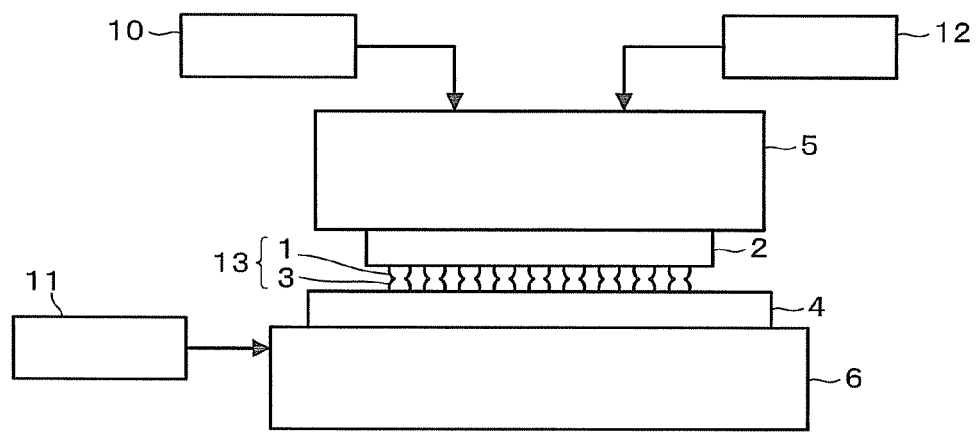
FIG. 3 is a diagram showing a partially connection process of the first solder bump and the second solder bump in the method for manufacturing the semiconductor device of the first embodiment.

FIG. 1 to FIG. 4 are diagrams showing manufacturing processes of a semiconductor device according to a first embodiment. The first embodiment is a method for manufacturing a semiconductor device to which flip-chip connection not using a flux agent is applied. As shown in FIG. 1, there are prepared a first substrate 2 having a first solder bump 1 and a second substrate 4 having a second solder bump 3. The first substrate 2 is suction-held, for example, by a tool 5. The second substrate 4 is disposed on a stage 6. A position adjustment process shown in FIG. 1 to a partially connection process shown in FIG. 3 are performed by using a flip-chip bonder having a position adjustment mechanism, a heating mechanism, a height control mechanism and the like.

The first and second substrates 2, 4 are a semiconductor chip (silicon (Si) chip or the like) and an interposer chip (silicon (Si) interposer or the like) for example. A combination of the first and second substrates 2, 4 is, for example, a combination of a first semiconductor chip (2) and a second semiconductor chip (4), a combination of a semiconductor chip (2) and an Si interposer (4), a combination of an Si interposer (2) and a semiconductor chip (4) or the like, and is not limited in particular.

The first and second solder bumps 1, 3 are each arranged in a matrix shape in predetermined regions of the substrates 2, 4. The solder bumps 1, 3 are formed on electrode terminals (not shown) provided on surfaces of the substrates 2, 4 via barrier metal layers (not shown) or the like. As a composing material of the solder bumps 1, 3, there is used a lead free solder alloy such as an Sn—Ag system solder alloy, an Sn—Cu system solder alloy, an Sn—Ag—Cu system solder alloy, an Sn—Bi system solder alloy, an Sn—In system solder alloy, or an Sn—Zn system solder alloy for example, or an Sn—Pb system solder alloy. As a forming material of the solder bumps 1, 3, the Sn—Ag system solder alloy or the Sn—Cu system solder alloy is suitable.

The solder bumps 1, 3 are formed by a plating method for example, or formed by using micro-balls made of a solder alloy. Though an oxidation film does not exist on surfaces of the solder bumps 1, 3 immediately after being formed on the substrates 2, 4, when time passes, the surfaces of the solder bumps 1, 3 are oxidized as shown in FIG. 5A. Oxidation films 7 formed on the surfaces of the solder bumps 1, 3 cause generation of a void in the solder bumps 1, 3 in permanently connecting the solder bumps 1, 3 or generation of an increase of resistance or a connection failure between the solder bumps 1, 3. Therefore, the oxidation films 7 need to be removed before permanent connection of the solder bumps 1, 3 is done.

In flip-chip connecting the first substrate 2 and the second substrate 4, first, as shown in FIG. 1, the first solder bump 1 and the second solder bump 3 are aligned by a position adjustment mechanism 8. Next, as shown in FIG. 2, while a load applied to the first substrate 2 is controlled by a load detection mechanism 9, the first solder bump 1 and the second solder bump 3 are placed in contact with each other (FIG. 5A). On this occasion, a flux agent is not used. It is preferable that a contact load between the solder bumps 1, 3 is a low load in a range in which the solder bumps 1, 3 melted in a next process can be unified. If a load to pressure-bond the solder bumps 1, 3 is applied at this stage, it becomes difficult to move the oxidation film 7 trapped between contact interfaces of the solder bumps 1, 3 to an outer peripheral surface side in the next process.

In a contact process of the first solder bump 1 and the second solder bump 3, it is preferable that a load (contact load between the solder bumps 1, 3) applied to the first substrate 2 is adjusted so that a sum H1 of heights of the solder bumps 1, 3 after contact is in a range equal to or larger than 90% to equal to or smaller than 100% in relation to a sum H of initial heights of the solder bumps 1, 3. If the contact load by which the height H1 after contact becomes smaller than 90% in relation to the initial height H, there is a possibility that removability of the oxidation film 7 trapped between the contact interfaces of the solder bumps 1, 3 is deteriorated. It suffices that the height H1 after contact is equal to or smaller than the initial height H, but when diversity or the like in height of the multiple solder bumps is considered, it is preferable that the contact load is adjusted so that the height H1 after contact is equal to or smaller than 95% in relation to the initial height H. Specifically, it is preferable that the contact load is about 0.5 MPa to 10 MPa per a solder bump.

Next, as shown in FIG. 3, heating to a temperature equal to or higher than a melting point of the first and second solder bumps 1, 3 is performed by a heating mechanism 10 of the tool 5 and a heating mechanism 11 of the stage 6, so that the first solder bump 1 and the second solder bump 3 are melted to form a partially connection (temporary connection) body 13. In a partially connection (temporary connection) process of the solder bumps 1, 3, first, while a contact state (height H1) of the first solder bump 1 and the second solder bump 3 is maintained, the solder bumps 1, 3 are heated and melted. Next, while a sum H2 of heights of the solder bumps in a melted state is controlled by a height control mechanism 12, the first substrate 2 is lowered to adjust a distance between the substrates 2, 4, thereby to deform shapes of the solder bumps 1, 3 in the melted state (FIG. 5B). After the melted state of the solder bumps 1, 3 is held for a predetermined period, cooling is performed.

As described above, by adjusting the height (distance between the first and second substrates 2, 4) of the solder bumps 1, 3 so that the melted solder bumps 1, 3 are deformed sufficiently, solder in the melted state inside the solder bump 1, 3 flows. As a result, a crack occurs in the oxide film 7 covering the surface, and moving or splitting occurs. The liquefied solder of the upper and lower bumps 1, 3 is made directly contact with each other and unified, beginning at the crack of the oxide film 7, and the oxide film 7 moves to a side face due to a surface tension of the solder in the melted state. In other words, a partially connection body 13 in which the solder bumps 1, 3 are directly unified can be formed without leaving the oxide film 7 on the contact interfaces of the solder bumps 1, 3. The oxidation film 7 exists only on a side face (surface) of the partially connection body 13.

A variation amount from the height H1 of the solder bumps 1, 3 in the melted state to the height H2 of the solder bumps 1, 3 after deformation is adjusted, with diversity in heights of the solder bumps 1, 3 being considered, so that the solder bumps 1, 3 can be sufficiently deformed and so that the solder bumps 1, 3 are not crushed to make neighboring bumps contact with each other, leading to a short circuit. It is preferable that the height of the solder bumps 1, 2 (height of the partially connection body 13) is adjusted so that the height H2 of the solder bumps 1, 3 after deformation is in a range of 20% to 80% in relation to the initial height H of the solder bumps 1, 3. Adjustment of the height of the solder bumps 1, 3 is performed by applying a load to the first substrate 2 for example. It should be noted that, since the solder bumps 1, 3 are in a liquid state, a height can be adjusted only by a weight of the first substrate 2, depending on the circumstances.

If the solder bumps 1, 3 are deformed so that the height H2 after deformation in relation to the initial height H of the solder bumps 1, 3 is less than 20%, there is a larger possibility that the neighboring solder bumps 1, 3 contact with each other, causing a short circuit. With a deformation amount making the height H2 in relation to the height H exceed 80%, a flow state of the solder bumps 1,3 in the melted state and moving and splitting of the oxide film 7 are insufficient, and the oxide film 7 becomes apt to remain inside the partially connection body 13. This causes generation of a void inside a connection body made of the solder bumps 1, 3 or generation of a connection failure between the solder bumps 1, 3. The partially connection body 13 formed by adjusting the height has a connection shape of a "snowman"-like shape which has a constricted portion as shown in FIG. 5B.

Figure 4:
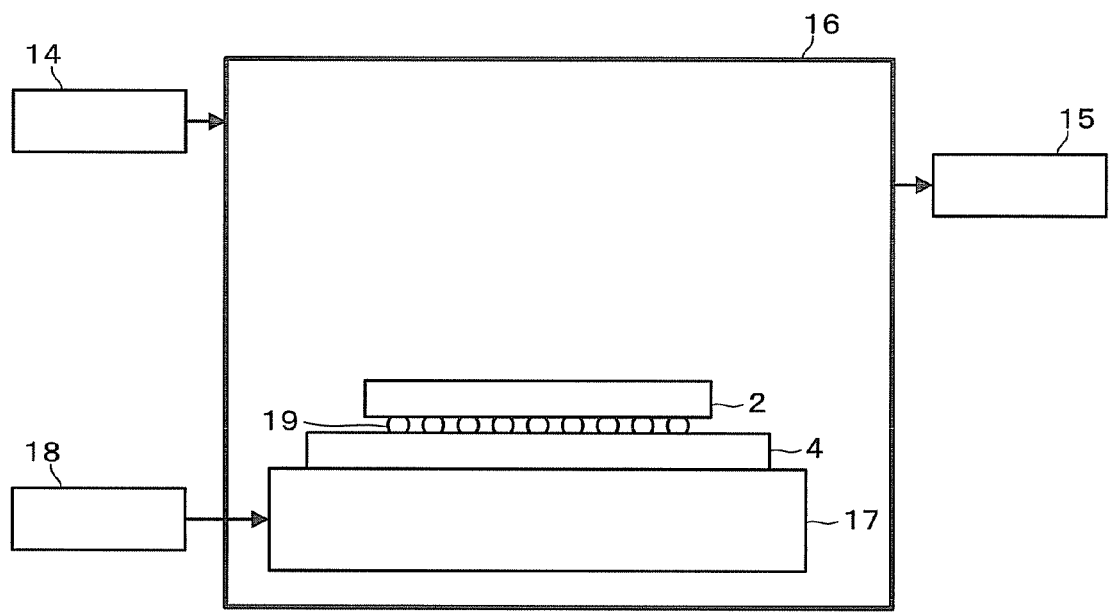
FIG. 4 is a diagram showing a permanent connection process of the first solder bump and the second solder bump in the method for manufacturing the semiconductor device of the first embodiment.

Thereafter, as shown in FIG. 4, the partially connected first and second substrates 2, 4 are disposed on a stage 17 provided in a reflow chamber 16 having a reduction gas supply mechanism 14 and an exhaust mechanism 15. The stage 17 has a heating mechanism 18. While supply of atmosphere gas containing a reducing agent to the reflow chamber 16 and exhaust are being done, the partially connection body 13 of the solder bumps 1, 3 are heated to a temperature equal to or higher than the melting point of the solder bumps 1, 3 and melted. Melting of the partially connection body 13 is performed in a reducing atmosphere, and can be performed in a reducing atmosphere in a decompression state.

While the oxide film 7 existing on a surface of the partially connection body 13 is reduced and removed by reducing gas, as described above, the partially connection body 13 is cooled after being melted, whereby permanent connection of the first substrate 2 and the second substrate 4 is completed. A permanent connection body 19 of the solder bumps 1, 3 has, as shown in FIG. 5C, a connection shape of a spherical shape without a constricted portion. As a reducing atmosphere for removing the oxide film 7, an atmosphere in which a reducing agent, such as hydrogen or a carboxylic acid, and inert gas or nitrogen gas are mixed is used.

The carboxylic acid used as the reducing agent is not limited in particular, and there can be cited an aliphatic univalent or bivalent lower carboxylic acid such as a formic acid, an acetic acid, an acrylic acid, a propionic acid, an oxalic acid, a succinic acid, or a malonic acid, for example. It is preferable to use the formic acid among these since the formic acid is of a low cost and is superior in a reducing effect of the oxide film 7. In particular, mixed gas of the formic acid and nitrogen is suitable, and it is preferable to adjust a mixture ratio so that the formic acid is in a range of 0.05 vol % to 15 vol %. If a ratio of the formic acid is too low, necessity occurs for making a reflow time long, and if the ratio of the formic acid is too high, a void is apt to occur. It is more preferable that the ratio of the formic acid is in a range of 0.1 vol % to 10 vol %.

The oxide film 7 existing on the surface of the partially connection body 13 is reduced by the reducing agent in the atmosphere, and reaction products (gas) generated by a reduction reaction of the oxide film 7, such as oxygen, water, carbon oxide, and carbon monoxide, are diffused into the atmosphere and removed. Since the oxide film 7 exists on the surface of the partially connection body 13, the reaction product generated by the reduction reaction of the oxide film 7 is not closed inside the permanent connection body 19. Further, since the oxide film 7 existing on the contact interfaces of the solder bumps 1, 3 has been moved to an outer peripheral surface side in the temporarily connecting process, the oxide film 7 does not remain inside the permanent connection body 19. Therefore, it becomes possible to suppress generation of a void or a connection failure originating in the oxide film 7 or its reduction reaction product.

Further, since reflow joint is performed under the reducing atmosphere, a good connection state or connection shape can be obtained without performing a removing process of the oxide film 7 before the contact process or the partially connection process of the first solder bump 1 and the second solder bump 3. If the removing process of the oxide film 7 is performed before the connection process (pressure-bonding process or the like) of the solder bumps 1, 3, a proper management of a time between the removing process of the oxide film 7 and the connection process of the solder bumps 1, 3 or of an atmosphere is necessary in a mass production line, resulting in an increase of a manufacturing cost. According to a method for manufacturing a semiconductor device of this embodiment, a permanent connection body 19 in which generation of a void or a connection failure is suppressed can be obtained at a low cost.

A structure (connection body of the first substrate 2 and the second substrate 4) taken out from the reflow chamber 16 is transferred to an assembly process similarly to an ordinary semiconductor device. The assembly process is selected in correspondence with the semiconductor device and is not limited in particular. One example will be described. First, a thermosetting underfill resin is filled in a space between the first substrate 2 and the second substrate 4 and is cure-processed and cured. Further, after a connection body of the first substrate 2 and the second substrate 4 is mounted on a third substrate made of a wiring board for example, the connection body and the third substrate is connected by wire bonding or the like. After such a structure is resin-molded, an outer lead ball is disposed and an external connection terminal of a semiconductor device (semiconductor package) is formed.

Second Embodiment

Figure 6:
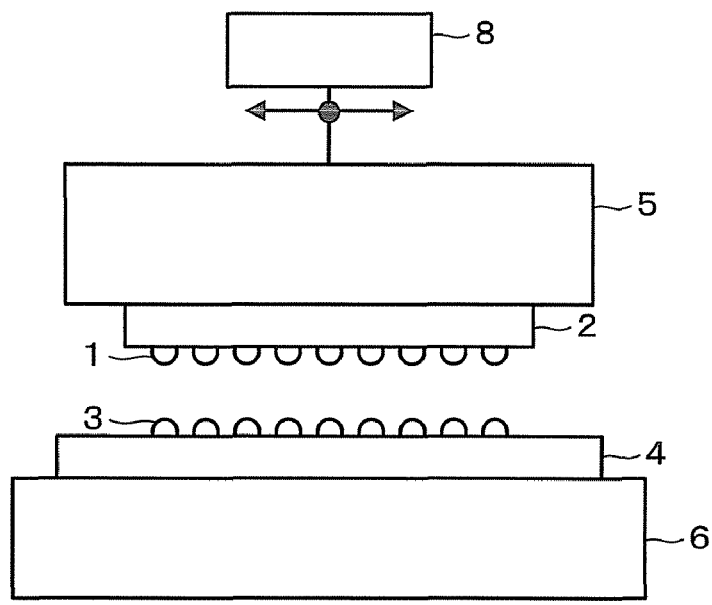
FIG. 6 is a diagram showing a position adjustment process of a first solder bump and a second solder bump in a method for manufacturing a semiconductor device of a second embodiment.
Figure 7:
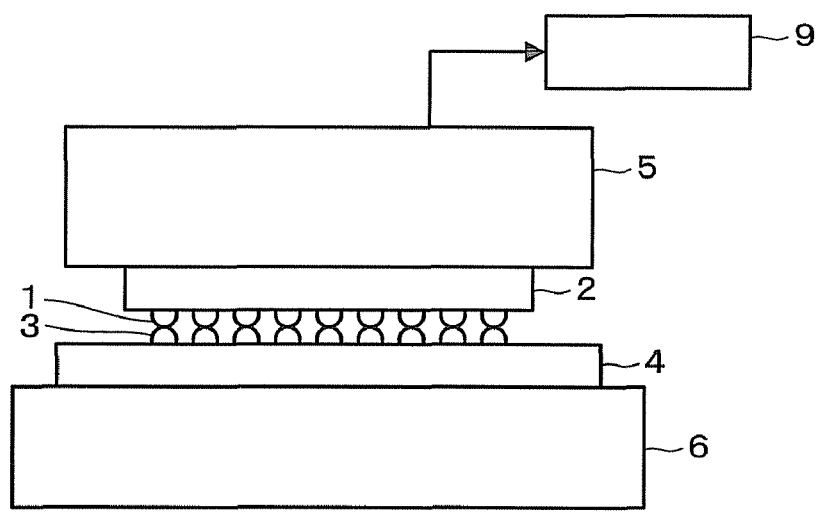
FIG. 7 is a diagram showing a contact process of the first solder bump and the second solder bump in the method for manufacturing the semiconductor device of the second embodiment.
Figure 8:
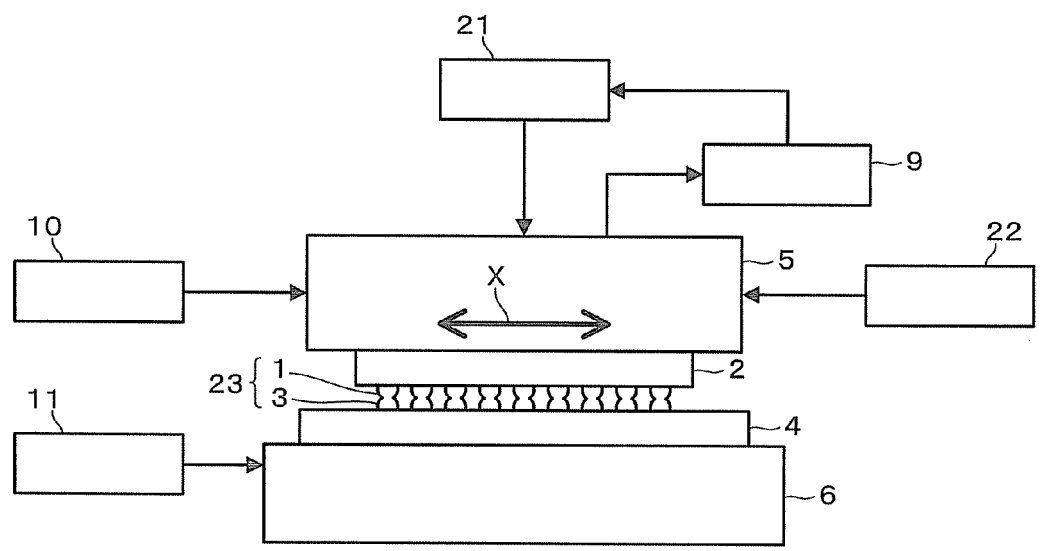
FIG. 8 is a diagram showing a partially connection process of the first solder bump and the second solder bump in the method for manufacturing the semiconductor device of the second embodiment.

FIG. 6 to FIG. 9 are diagrams showing manufacturing processes of a semiconductor device according to a second embodiment. In the manufacturing processes of the semiconductor device according to the second embodiment, first, similarly to the first embodiment, a first substrate 2 having a first solder bump 1 and a second substrate 4 having a second solder bump 3 are prepared, and the first solder bump 1 and the second solder bump 3 are position-adjusted as shown in FIG. 6. A concrete example of the substrates 2, 4, a composing material of the solder bumps 1, 3, a position adjustment method of the solder bumps 1, 3 and the like are similar to those in the first embodiment. Further, a position adjustment process shown in FIG. 6 to a partially connection process shown in FIG. 8 are performed by using a flip-chip bonder having a position adjustment mechanism, a pressure mechanism, a heating mechanism, an ultrasonic generation mechanism and the like.

Next, as shown in FIG. 7, the first solder bump 1 and the second solder bump 3 are made contact with each other without using a flux agent. A contact process of the solder bumps 1, 3 are performed similarly to the first embodiment. It is preferable that a height of the solder bumps 1, 3 after contact and a load are similar to those in the first embodiment. Next, as shown in FIG. 8, while the load is applied to the solder bumps 1, 3 in contact with each other by a pressure mechanism 21, an ultrasonic energy is applied to contact interfaces of the solder bumps 1, 3 from an ultrasonic generation mechanism 22. In the drawing, an arrow X indicates a vibration direction by an ultrasonic wave. In this way, a partially connection body 23 of the first solder bump 1 and the second solder bump 3 is formed.

In a forming process of the partially connection body 23, it is preferable to apply a load to locally deform the solder bumps 1, 3. It is preferable that the load applied to the solder bumps 1, 3 is controlled by a load detection mechanism 9, for example. By simultaneously performing above-described local deformation of the solder bumps 1, 3 and application of the ultrasonic energy, a crack occurs in an oxide film sandwiched by the contact interfaces to cause moving or splitting, and at the same time, the ultrasonic energy acts on the entire solder bumps 1, 3 and a cracked portion of the oxide film so that the first solder bump 1 and the second solder bump 3 are fused. The ultrasonic energy accelerates softening of a solder material and deformation based thereon, and further, diffusion of a solder atom, whereby the first solder bump 1 and the second solder bump 3 are fused.

In forming the partially connection body 23, the oxide films existing on surfaces of the solder bumps 1, 3 move to a side face of the partially connection body 23 by diffusion of the solder atom and vibration of the ultrasonic energy. In other words, the partially connection body 23 in which the solder bumps 1, 3 are directly unified can be formed without leaving the oxide film on the contact interfaces of the solder bumps 1, 3. The partially connection body 23 formed by such a process has a connection shape of a "snowman"-like shape which has a constricted portion similarly to the first embodiment.

An application process of the ultrasonic energy can be performed under a room temperature or performed while heating the solder bumps 1, 3 by a heating mechanism 10 of a tool 5 or by a heating mechanism 11 of a stage 6. By applying the ultrasonic energy while heating the solder bumps 1, 3, the solder bumps 1, 3 are further softened and become easy to be deformed, and thus the oxide film becomes easy to be removed by the ultrasonic energy. Further, the contact process or the partially connection process of the solder bumps 1, 3 can be performed basically without removing the oxide film formed on the surfaces of the solder bumps 1, 3, but can be performed after removing an excessive oxide film in advance. This applies similarly to the first embodiment.

Figure 9:
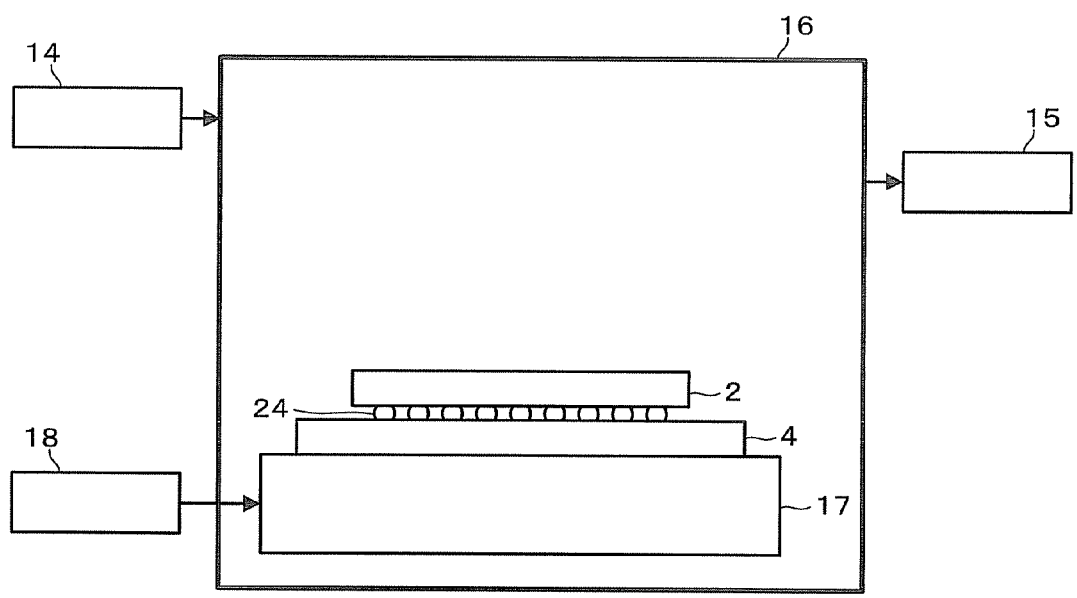
FIG. 9 is a diagram showing a permanent connection process of the first solder bump and the second solder bump in the method for manufacturing the semiconductor device of the second embodiment.

Thereafter, as shown in FIG. 9, the partially connected first and second substrates 2, 4 are disposed in a reflow chamber 16, and while supply of atmosphere gas containing a reducing agent to the reflow chamber 15 and exhaust are being done, the partially connection body 23 of the solder bumps 1, 3 are heated to a temperature equal to or higher than a melting point of the solder bumps 1, 3 and melted. Similarly to the first embodiment, while the oxide film existing on a surface of the partially connection body 23 is removed by reducing with reducing gas, the partially connection body 23 is cooled after being melted, whereby permanent connection of the first substrate 2 and the second substrate 4 is completed. A permanent connection body 24 made by the solder bumps 1, 3 has, similarly to the first embodiment, a connection shape of a spherical shape without a constricted portion. A structure taken out from the reflow chamber 16 is transferred to an assembly process similar to that of the first embodiment.

With regard to the reducing agent and the reducing atmosphere containing the reducing agent, similar materials to those in the first embodiment are used. Further, a concrete condition or the like are similar to that in the first embodiment. Since the oxide film exists on the surface of the partially connection body 23, similarly to the first embodiment, a reaction product generated by a reduction reaction of the oxide film is not closed inside the permanent connection body 24. Since the oxide films existing on the contact interfaces of the solder bumps 1, 3 have been moved to outer peripheral surface sides in the temporarily connecting process, the oxide film does not remain inside the permanent connection body 24. Therefore, it becomes possible to suppress generation of a void or a connection failure originating in the oxide film or its reduction reaction product. Further, similarly to the first embodiment, since a good connection state or connection shape can be obtained without performing a removing process of the oxide film before the contact process or partially connection process of the solder bumps 1, 3, a permanent connection body 24 in which generation of a void or a connection failure is suppressed can be obtained at a low cost.

Next, working examples and their evaluation results will be described.

Example 1

There were prepared a first semiconductor chip on which a solder bump of an Sn-0.7 mass % Cu composition is formed on an electrode terminal by an electroplating method and a second semiconductor chip of a connected side to which the first semiconductor chip is to be mounted. A solder bump of an Sn-0.7 mass % Cu composition is formed on an electrode terminal of the second semiconductor chip, similarly to the first semiconductor chip. The electrode terminal of the first semiconductor chip and the electrode terminal of the second semiconductor chip are disposed at corresponding predetermined positions so as to be able to be connected with each other. The number of terminals is about 2000, a height of the solder bump is 20 µm, a minimum value of a pitch of neighboring terminals is 60 µm. A flux agent is not used.

After the first semiconductor chip held by a tool and the second semiconductor chip held by a stage were aligned by a flip-chip bonder having a position-adjustment mechanism, a heating mechanism, a pressure mechanism, and a tool height control mechanism, the corresponding solder bumps were placed in contact with each other. A contact load was measured by a load detection mechanism, and was set to be 1 N (about 0.7 MPa per one bump) being a load which hardly crushes the solder bump. A height H1 of the solder bumps after contact was set to be 95% of an initial height H (40 μm) of the solder bumps. A distance d1 between the semiconductor chips making such a bump height H1 was to be a standard of a next process.

Next, while relative positions of the two semiconductor chips in a plane direction ware maintained, temperatures of the tool and the stage were heightened to 250° C. and heating was performed so that temperatures of contact interfaces of the solder bumps become equal to or higher than a melting point (227° C.) of an Sn—Cu solder. Subsequently, in order that a height H2 of the solder bumps in a melted state becomes 70% of the initial height H of the solder bumps, pressurizing was performed so that a distance d2 between the semiconductor chips is decreased by 10 μm from the distance d1 at a contact time, and the two semiconductor chips ware held for 25 seconds while the chip distance d2 (bump height H2) is being maintained.

Figure 10:
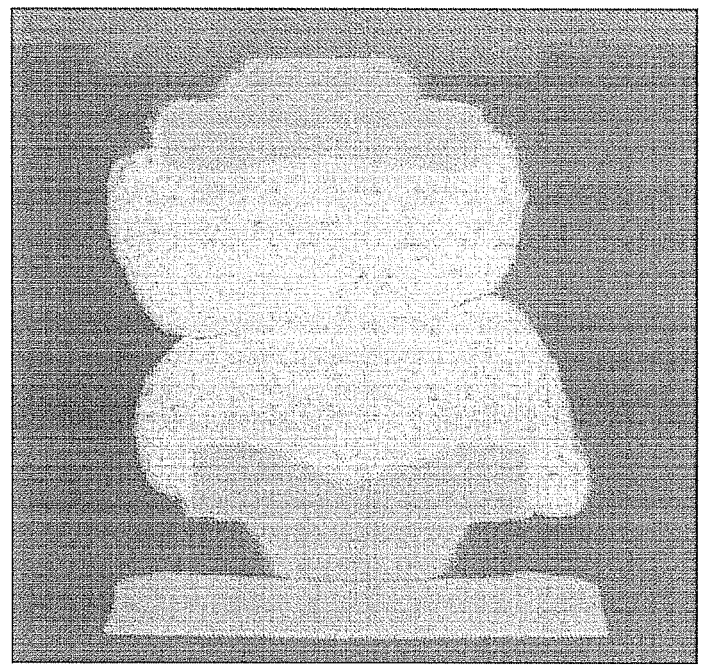
FIG. 10 is an enlarged photograph showing a partially connection body of a first solder bump and a second solder bump in Example 1.

Then, the solder bump in the melted state was cooled to a room temperature, whereby a partially connection body of the semiconductor bumps was formed. An enlarged photograph of the partially connection body of solder bump is shown in FIG. 10. As is obvious from FIG. 10, the solder bump of the first semiconductor chip and the solder bump of the second semiconductor chip were directly fused in central parts thereof, and a constricted portion being an interface remaining was found in a side face side. As described above, a partially connection body of the solder bumps had a connection shape of a "snowman"-like shape.

Thereafter, the partially connection body of the solder bumps was disposed in a reflow chamber, and while supply of nitrogen gas atmosphere in which a formic acid of 5 mass % was mixed and exhaust ware being done, the partially connection body of the solder bumps was heated at 250° C. for 60 seconds and melted again. By cooling the above to a room temperature, a connection body (permanent connection body) made by the solder bumps was formed. An enlarged photograph of the connection body made by the solder bumps is shown in FIG. 11.

Figure 11:
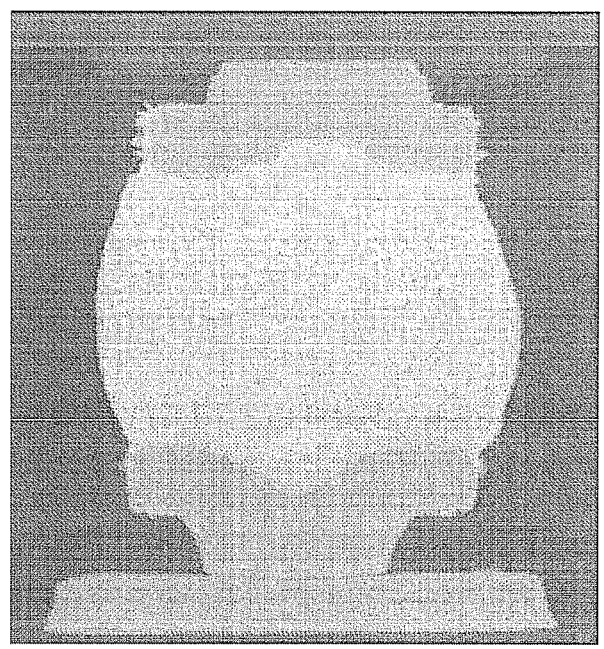
FIG. 11 is an enlarged photograph showing a permanent connection body of the first solder bump and the second solder bump in Example 1.

As is obvious from FIG. 11, a side face oxide film being a cause of a constricted portion was reduced and removed based on an oxide film reducing effect of the formic acid, a connection body having a good spherical shape is obtained. An internal state of the connection body was observed, and occurrence of a void was not found. Further, since a boiling point of the formic acid is sufficiently lower than a melting point of a solder alloy, it is confirmed that even an oxide film of the bump surface positioned near a center of the semiconductor chip was well reduced despite minuteness of a bump interval. Since the inside of the reflow chamber was evacuated after a heating processing, a formic acid remaining was not detected from the surface of the semiconductor chip after completion of the processes.

In Example 1, a case in which the solder bump made of a solder alloy of the Sn-0.7 mass % Cu composition is used is explained, but a similar result is obtained also in a case that a solder bump made of a solder alloy of an Sn-3.5 mass % Ag composition is used. As described above, by performing a permanent connection process (reflow process) of solder bumps after the contact process of the solder bumps and the partially connection process by melting of the solder bumps, occurrence of a void or a connection failure originating in the oxide film of the bump surface can be suppressed without using a flux agent.

Example 2

Two semiconductor chips the same as those of Example 1 were prepared and aligned under a room temperature by a flip-chip bonder having a position-adjustment mechanism, a heating mechanism, a pressure mechanism, and an ultrasonic generation mechanism, and thereafter, corresponding solder bumps were placed in contact with each other. A contact load was similar to that of Example 1. Next, while a pressuring force of 10 N was applied to the solder bumps having been made contact with each other, an ultrasonic vibration of 50 kHz and 40 W was applied for 8 seconds, whereby a partially connection body of the solder bumps was formed.

Figure 12:
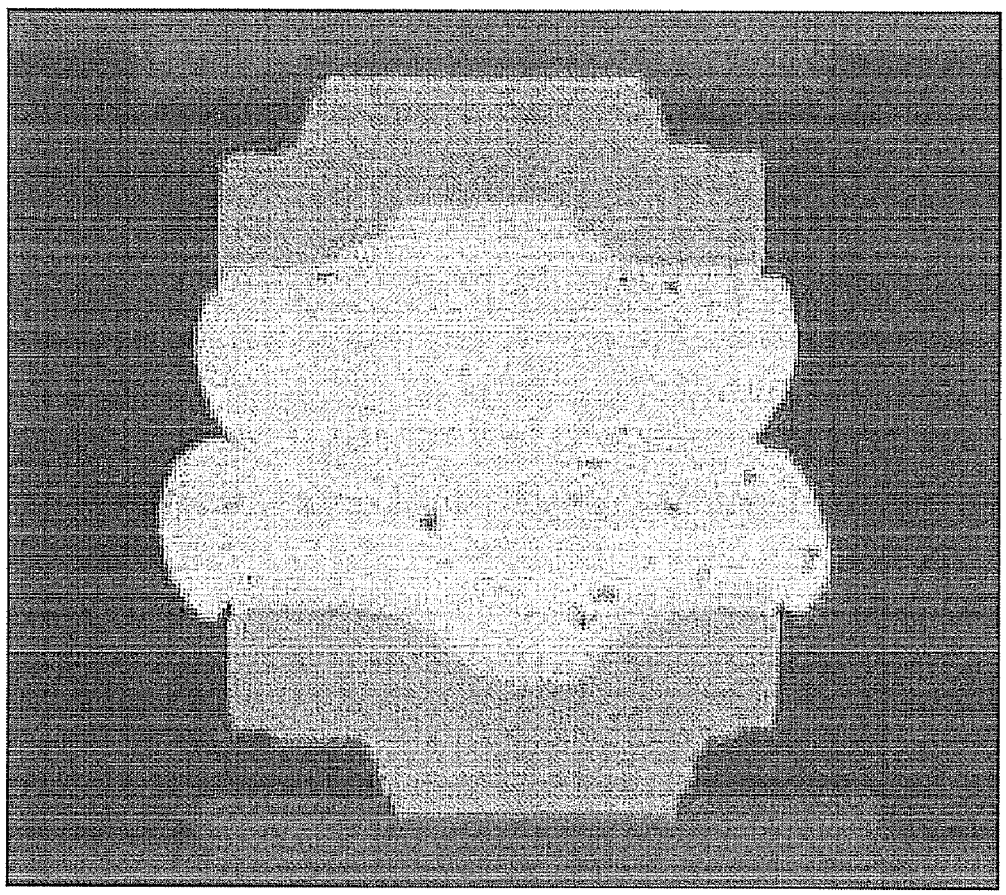
FIG. 12 is an enlarged photograph showing a partially connection body of a first solder bump and a second solder bump in Example 2.

An enlarged photograph of the partially connection body of the solder bumps is shown in FIG. 12. As is obvious from FIG. 12, similarly to Example 1 to which melting of the solder bump is applied, central parts of the solder bumps were directly fused also in a partially connection body of Example 2 to which application of an ultrasonic energy was applied, and a constricted portion being interface remains was found in a side face. As described above, the partially connection body of the solder bumps had a connection shape of a "snowman"-like shape. Some samples were taken out in that state and a shear strength is measured, and a joint strength equal to or larger than 1.4 MPa in area conversion of the solder bump is obtained.

Thereafter, the partially connection body of the solder bumps was disposed in a reflow chamber, and while supply of nitrogen gas atmosphere in which a formic acid of 5 mass % was mixed and exhaust ware being done similarly to Example 1, the partially connection body of the solder bumps was heated at 250° C. for 60 seconds and melted again. By cooling the above to a room temperature, a connection body (permanent connection body) made by the solder bumps was formed. In checking of a state of the connection body made by the solder bumps, similarly to Example 1, a side face oxide film being a cause of a constricted portion was reduced and removed, the connection body having a good spherical shape, and occurrence of a void was not found inside. Further, even an oxide film of the bump surface positioned near a center of a semiconductor chip was well reduced.

In Example 2, a case in which the solder bump made of a solder alloy of the Sn-0.7 mass % Cu composition is used is explained, but a similar result is obtained also in a case that a solder bump made of a solder alloy of an Sn-3.5 mass % Ag composition is used. As described above, after a contact process of the solder bumps and a partially connection process by application of an ultrasonic energy are performed, a permanent connection process (reflow process) of the solder bumps is performed, whereby generation of a void or a connection failure originating in an oxide film of a bump surface can be effectively suppressed without using a flux agent.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
   aligning a first solder bump provided on a first substrate and a second solder bump provided on a second substrate;
   contacting the first solder bump and the second solder bump while controlling a load applied to the first and second solder bumps by a load detector;

melting the first and second solder bumps by heating to a temperature equal to or higher than a melting point of the first and second solder bumps while maintaining a height of the first solder bump and the second solder bump which are in contact with each other, to form a partial connection body of the first solder bump and the second solder bump;

deforming the first and second solder bumps in a melted state by adjusting a distance between the first substrate and the second substrate while controlling the height of the first solder bump and the second solder bump in the melted state by a height controller, wherein oxide films existing on surfaces of the first and second solder bumps are moved to a side face of the partial connection body at a time of deforming the first and second solder bumps in the melted state;

cooling the partial connection body; and heating the partial connection body after the cooling to a temperature equal to or higher than the melting point of the first and second solder bumps in a reducing atmosphere, to form a permanent connection body by melting the partial connection body while removing the oxide film existing on the side face of the partial connection body.

2. The method for manufacturing the semiconductor device as set forth in claim 1,
wherein the partial connection body has a connection shape having a constricted portion, and the permanent connection body has a connection shape not having a constricted portion.

3. The method for manufacturing the semiconductor device as set forth in claim 1,
wherein the first solder bump and the second solder bump are placed in contact with each other so that a sum H1 of heights of the first and second solder bumps after contact becomes in a range of 90% to 100% in relation to a sum H of initial heights of the first and second solder bumps.

4. The method for manufacturing the semiconductor device as set forth in claim 1,
wherein the first solder bump and the second solder bump are placed in contact with each other while a load is applied.

5. The method for manufacturing the semiconductor device as set forth in claim 1,
wherein the distance between the first substrate and the second substrate is adjusted so that a sum H2 of heights of the first and the second bumps in the melted state becomes in a range of 20% to 80% in relation to a sum H of initial heights of the first and second solder bumps, to form the partial connection body.

6. The method for manufacturing the semiconductor device as set forth in claim 1,
wherein the first and second solder bumps in the melted state are deformed by applying a load.

7. The method for manufacturing the semiconductor device as set forth in claim 1,
wherein the reducing atmosphere contains carboxylic acid gas.

8. The method for manufacturing the semiconductor device as set forth in claim 1,
wherein the reducing atmosphere contains a mixed gas of carboxylic acid gas and nitrogen gas.

9. The method for manufacturing the semiconductor device as set forth in claim 1,
wherein each of the first and second substrates comprises a semiconductor chip or an interposer chip.

10. A method for manufacturing a semiconductor device, comprising:
aligning a first solder bump provided on a first substrate and a second solder bump provided on a second substrate;

contacting the first solder bump and the second solder bump while controlling a load applied to the first and second solder bumps by a load detector;

applying an ultrasonic energy and the load to the first and second solder bumps while controlling the load by the load detector, to form a partial connection body of the first solder bump and the second solder bump, wherein oxide films existing on surfaces of the first and second solder bumps are moved to a side face of the partial connection body at a time of applying the ultrasonic energy and the load; and heating the partial connection body to a temperature equal to or higher than a melting point of the first and second solder bumps in a reducing atmosphere, to form a permanent connection body by melting the partial connection body while removing the oxide film existing on the side face of the partial connection body.

11. The method for manufacturing the semiconductor device as set forth in claim 10,
wherein the load is applied so that the first and second solder bumps are partially deformed.

12. The method for manufacturing the semiconductor device as set forth in claim 10,
wherein the partial connection body has a connection shape having a constricted portion, and the permanent connection body has a connection shape not having a constricted portion.

13. The method for manufacturing the semiconductor device as set forth in claim 10,
wherein the first solder bump and the second solder bump are placed in contact with each other so that a sum H1 of heights of the first and second solder bumps after contact becomes in a range of 90% to 100% in relation to a sum H of initial heights of the first and second solder bumps.

14. The method for manufacturing the semiconductor device as set forth in claim 10,
wherein the reducing atmosphere contains carboxylic acid gas.

15. The method for manufacturing the semiconductor device as set forth in claim 10,
wherein the reducing atmosphere contains mixed gas of carboxylic acid gas and nitrogen gas.

16. The method for manufacturing the semiconductor device as set forth in claim 10,
wherein each of the first and second substrates comprises a semiconductor chip or an interposer chip.

* * * * *